US007852309B2

(12) United States Patent
Chung

(10) Patent No.: US 7,852,309 B2
(45) Date of Patent: Dec. 14, 2010

(54) SCAN DRIVER AND ORGANIC LIGHT EMITTING DISPLAY DEVICE HAVING THE SAME

(75) Inventor: Bo-Yong Chung, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 1150 days.

(21) Appl. No.: 11/490,755

(22) Filed: Jul. 20, 2006

(65) Prior Publication Data

US 2007/0024539 A1 Feb. 1, 2007

(30) Foreign Application Priority Data

Aug. 1, 2005 (KR) ..................... 10-2005-0070395

(51) Int. Cl.
*G09G 3/36* (2006.01)
*G11C 19/00* (2006.01)
*H03K 19/20* (2006.01)

(52) U.S. Cl. ........................... 345/100; 345/98; 345/99; 377/64; 377/67; 377/81; 326/104

(58) Field of Classification Search ............. 345/76-83, 345/98-100; 377/64-81; 326/104, 112-122, 326/128, 133
See application file for complete search history.

(56) References Cited

U.S. PATENT DOCUMENTS

| | | | | |
|---|---|---|---|---|
| 3,829,713 | A * | 8/1974 | Canning | 377/105 |
| 4,209,713 | A * | 6/1980 | Satou et al. | 327/310 |
| 5,384,496 | A | 1/1995 | Tanaka | |
| 5,654,659 | A | 8/1997 | Asada | |
| 5,712,653 | A * | 1/1998 | Katoh et al. | 345/100 |
| 6,670,771 | B2 * | 12/2003 | Shin et al. | 315/169.2 |
| 2002/0153926 | A1 * | 10/2002 | Yoshizawa | 326/119 |
| 2003/0174115 | A1 * | 9/2003 | Washio et al. | 345/98 |
| 2005/0264493 | A1 * | 12/2005 | Shin | 345/76 |
| 2005/0264496 | A1 * | 12/2005 | Shin | 345/76 |

FOREIGN PATENT DOCUMENTS

| | | | |
|---|---|---|---|
| CN | 1622180 | A | 6/2005 |

(Continued)

OTHER PUBLICATIONS

Chinese Certificate of Patent, dated Mar. 25, 2009, for corresponding Chinese application 200610108990.6, noting listed references in this IDS.

Japanese Notice of Allowance dated Dec. 15, 2009, for corresponding Japanese application 2006-189367, noting listed references in this IDS.

*Primary Examiner*—Sumati Lefkowitz
*Assistant Examiner*—Jonathan Horner
(74) *Attorney, Agent, or Firm*—Christie, Parker & Hale, LLP

(57) ABSTRACT

Provided is a scan driver that supplies a scan signal to an organic light emitting display device (OLED). The scan driver includes transistors of the same conductivity type. To generate individual scan signals, the scan driver includes samplers, each of which samples an input signal in synchronization with a clock signal or an inverted clock signal; and an OR gate and a NAND gate, each of which performs a logical operation on output signals of adjacent samplers and generates a scan signal. The samplers, the OR gate and the NOR gate include transistors of the same conductivity type.

20 Claims, 7 Drawing Sheets

FOREIGN PATENT DOCUMENTS

| | | | |
|---|---|---|---|
| EP | 0 457 329 | B1 | 8/1995 |
| JP | 04-131822 | | 5/1992 |
| JP | 09-330059 | | 12/1997 |
| JP | 10-074062 | | 3/1998 |
| JP | 2006-154810 | | 6/2006 |
| JP | 2006-189756 | | 7/2006 |

* cited by examiner

SCAN DRIVER AND ORGANIC LIGHT EMITTING DISPLAY DEVICE HAVING THE SAME

CROSS-REFERENCE TO RELATED APPLICATION

This application claims priority to and the benefit of Korean Patent Application No. 10-2005-0070395, filed Aug. 1, 2005, in the Korean Intellectual Property Office, the entire content of which is incorporated herein by reference.

BACKGROUND OF THE INVENTION

1. Field of the Invention

The present invention relates to a scan driver for an organic light emitting display device (OLED) and, more particularly, to a scan driver that includes transistors of the same conductivity type.

2. Description of the Related Art

A scan driver supplies a scan signal to an active matrix (AM) organic light emitting display device (OLED). As the scan signal is supplied, a pixel of the OLED is selected, and a data signal is applied to the selected pixel. The pixel to which the data signal is applied stores the data signal and performs an emission operation in response to the stored data signal.

The scan driver is formed on a crystalline silicon substrate through a semiconductor fabricating process. The scan driver formed on the crystalline silicon substrate is electrically coupled to the pixels.

In recent years, a System On Panel (SOP) technique of forming the scan driver on an organic substrate on which an OLED is also formed has been utilized. Conductivity type of transistors of the scan driver may be the same as the conductivity type of transistors of the pixel so that the scan driver can be formed on the same substrate as the OLED. However, a complicated circuit for the scan driver having transistors of the same conductivity type as the transistors of the pixel does not yield satisfactory characteristics and requires a complicated fabricating process.

Therefore, there is a need for a simple circuit for the scan driver having transistors of the same conductivity type as the transistors of the pixel.

SUMMARY OF THE INVENTION

The present invention, therefore, provides a scan driver for an organic light emitting display device (OLED), which includes transistors of the same conductivity type as the transistors used in the pixels of the OLED and an OLED including the embodiments of the scan driver as well as a method for driving a scan driver to produce images on an OLED.

In an exemplary embodiment of the present invention, a scan driver includes a first sampler for sampling an input signal in synchronization with an inverted clock signal, a second sampler for sampling an output signal of the first sample in synchronization with a clock signal, a third sampler for sampling an output signal of the second sampler in synchronization with the inverted clock signal, an OR gate for performing a logical OR operation on the output signals of the first and second samplers and generating a first scan signal, and a NAND gate for performing a NAND operation on the output signal of the second sampler and an output signal of the third sampler and generating a second scan signal.

In another exemplary embodiment of the present invention, a scan driver includes a first sampler for sampling a start signal in synchronization with a first clock signal, a second sampler for sampling an output signal of the first sampler in synchronization with a second clock signal that is an inverted signal of the first clock signal, a third sampler for sampling an output signal of the second sampler in synchronization with the first clock signal, an OR gate for performing a logical OR operation on an input signal and the output signal of the second sampler and generating an odd scan signal, and a NAND gate for performing a NAND operation on an input signal and an output signal of the third sampler and generating an even scan signal, wherein transistors of the first sampler, the second sampler, the third sampler, the OR gate, and the NAND gate have the same conductivity type.

In another exemplary embodiment, an OLED is provided that includes a display region having pixels for displaying an image, a data driver coupled to the display region by data lines and is used for transmitting data signals to the pixels to display the image, a scan driver coupled to the display region by scan lines and is used for transmitting scan signals to the pixels to display the image. The scan driver used in the OLED includes a first sampler for sampling an input signal in synchronization with an inverted clock signal, a second sampler for sampling an output signal of the first sampler in synchronization with a clock signal, a third sampler for sampling an output signal of the second sampler in synchronization with the inverted clock signal,an OR gate for performing a logical OR operation on the output signal of the first sampler and the output signal of the second sampler to generate a first scan signal, and a NAND gate for performing a NAND operation on the output signal of the second sampler and an output signal of the third sampler to generate a second scan signal. The first scan signal and the second scan signal are provided to the display region to select the pixels for displaying the image.

Another embodiment of the invention presents a method for generating scan signals for input to scan electrodes of an OLED and for driving pixels included in the OLED to produce an image. The method includes receiving three input signals including a clock signal, an inverted clock signal, and a start signal, sampling the start signal using a first cycle of the inverted clock signal to generate a first sampled signal, inverting the first sampled signal to generate a first inverted sampled signal, sampling the first inverted sampled signal using a first cycle of the clock signal to generate a second sampled signal, inverting the second sampled signal to generate a second inverted sampled signal, generating a first scan signal by performing a logical OR operation on the first inverted sampled signal and the second inverted sampled signal, sampling the second inverted sampled signal using a second cycle of the inverted clock signal to generate a third sampled signal, inverting the third sampled signal to generate a third inverted sampled signal, and generating a second scan signal by performing a logical NAND operation on the second inverted sampled signal and the third inverted sampled signal.

BRIEF DESCRIPTION OF THE DRAWINGS

The above and other features of the present invention will be described in reference to certain exemplary embodiments thereof with reference to the attached drawings in which.

DETAILED DESCRIPTION

The present invention will now be described more fully hereinafter with reference to the accompanying drawings, in which exemplary embodiments of the invention are shown.

Figure 1:
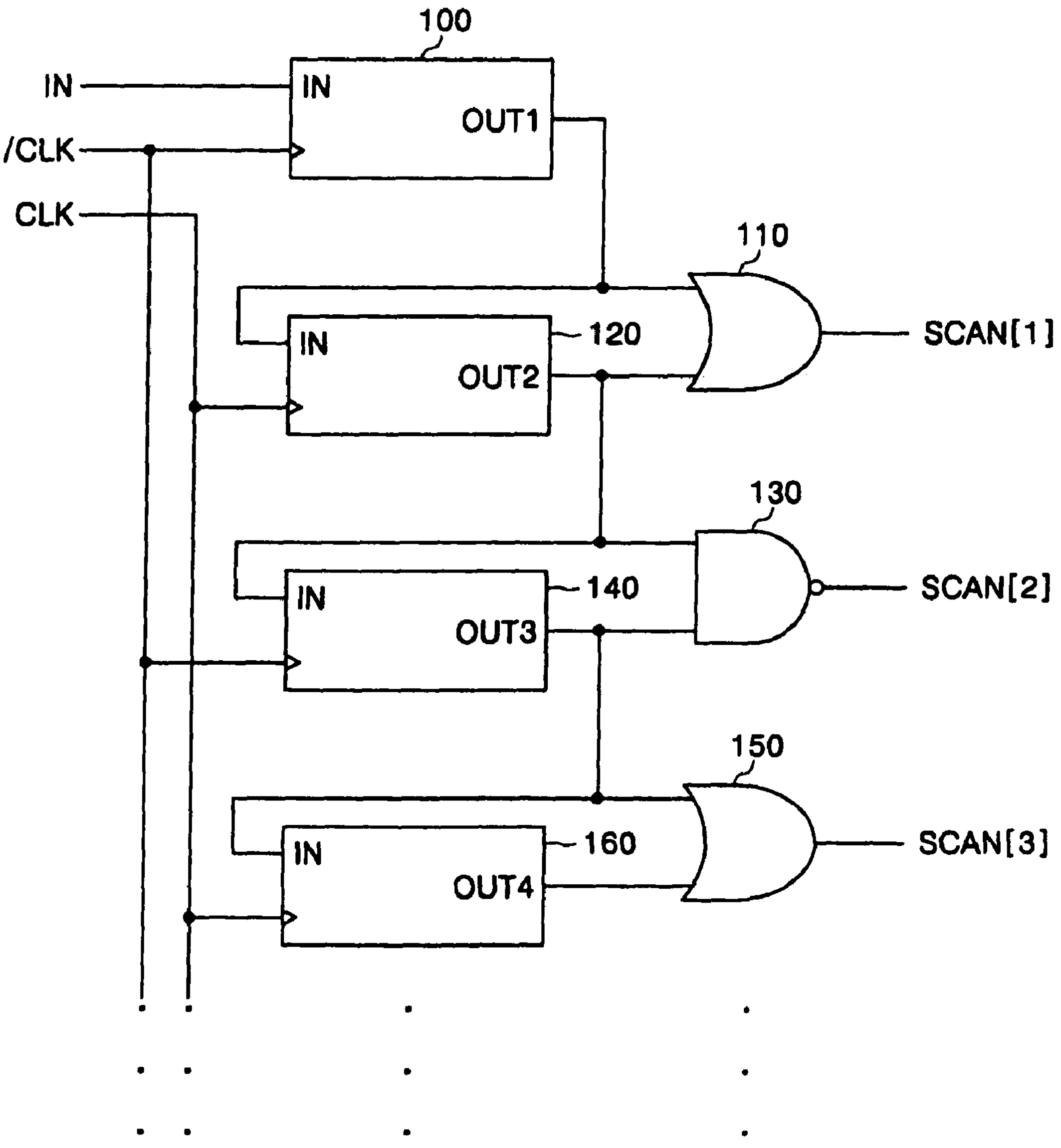
FIG. 1 is a block diagram of a scan driver for an organic light emitting display device (OLED) according to an exemplary embodiment of the present invention.

FIG. 1 is a block diagram of a scan driver for an organic light emitting display device (OLED) according to an exemplary embodiment of the present invention.

Referring to FIG. 1, the scan driver includes: samplers 100, 120, 140, and 160; and OR gates 110 and 150 and a NAND gate 130, each of which performs a logical operation on output signals of adjacent samplers.

The first sampler 100 receives a start signal IN and an inverted clock signal /CLK. The first sampler 100 samples the start signal IN on a falling edge of the inverted clock signal /CLK, inverts the sampled signal, and generates an output signal OUT1. The output signal OUT1 of the first sampler 100 is applied to the first OR gate 110 and to the second sampler 120.

The second sampler 120 receives the output signal OUT1 of the first sampler 100. Also, the second sampler 120 receives a clock signal CLK. The second sampler 120 samples the received signal OUT1 on a falling edge of the clock signal CLK, inverts the sampled signal, and generates an output signal OUT2. The output signal OUT2 of the second sampler 120 is applied to the first OR gate 110, the first NAND gate 130, and the third sampler 140.

The first OR gate 110 performs a logical OR operation on the output signals OUT1 and OUT2 and generates a first scan signal SCAN[1].

The third sampler 140 receives the output signal OUT2 of the second sampler 120. Also, the inverted clock signal /CLK is applied to the third sampler 140. The third sampler 140 samples the output signal OUT2 on the falling edge of the inverted clock signal /CLK, inverts the sampled signal, and generates an output signal OUT3. The output signal OUT3 of the third sampler 140 is applied to the first NAND gate 130, the second OR gate 150, and the fourth sampler 160.

The first NAND gate 130 receives the output signals OUT2 and OUT3, performs a NAND operation on the received signals, and generates a second scan signal SCAN[2].

The fourth sampler 160 receives the output signal OUT3 of the third sampler 140. Also, the clock signal CLK is applied to the fourth sampler 160. The fourth sampler 160 samples the output signal OUT3 on the falling edge of the clock signal CLK, inverts the sampled signal, and generates an output signal OUT4. The output signal OUT4 of the fourth sampler 160 is applied to the second OR gate 150, a second NAND gate (not shown), and a fifth sampler (not shown).

The second OR gate 150 receives the output signals OUT3 and OUT4, performs a logical OR operation on the received signals, and generates a third scan signal SCAN[3].

That is, the first OR gate 110 performs a logical OR operation on the output and input signals of the second sampler 120, that are OUT2 and OUT1 respectively. The first NAND gate 130 performs a NAND operation on the input and output signals of the third sampler 140, that are OUT2 and OUT3 respectively. Also, the OR gate 150 performs a logical OR operation on the output and input signals of the fourth sampler 160, that are OUT4 and OUT3 respectively. In summary, an OR gate, which generates an odd scan signal, performs a logical OR operation on input and output signals of an even sampler and generates an odd scan signal. Also, a NAND gate, which generates an even scan signal, performs a NAND operation on input and output signals of an odd sampler and generates an even scan signal. For example, OR gates 110 or 150 which generate the odd scan signals SCAN[1] or SCAN [3], perform a logical OR operation on input and output signals of the second sampler 120 or the fourth sampler 160, both even samplers, to generates the odd scan signals. Also, the NAND gate 130, which generates the even scan signal SCAN[2], performs a NAND operation on input and output signals of the third sampler 140, an odd sampler, to generates the even scan signal.

Figure 2:
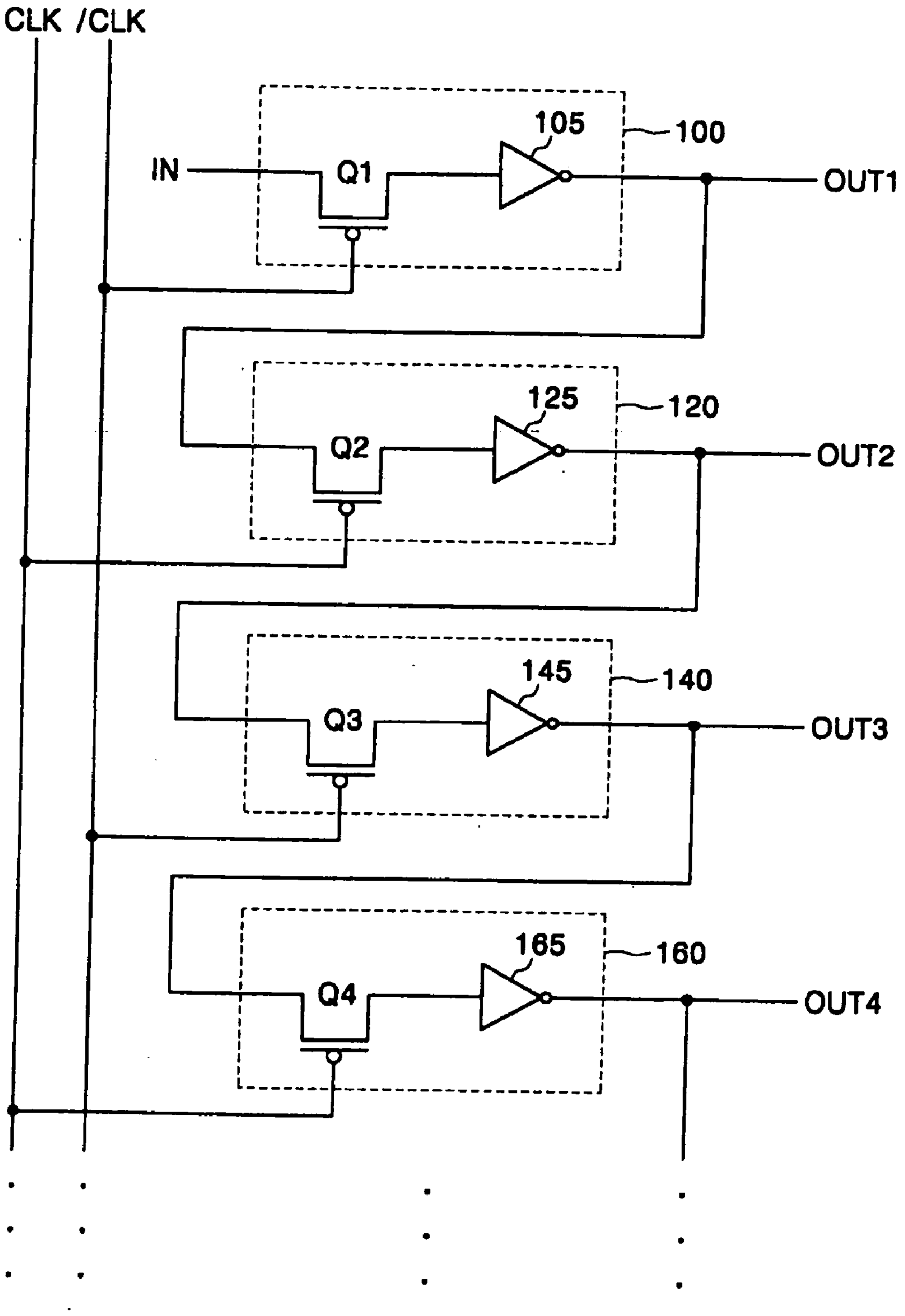
FIG. 2 is a circuit diagram of samplers shown in FIG. 1.

FIG. 2 is a circuit diagram of the samplers shown in FIG. 1.

Referring to FIG. 2, each of the samplers 100, 120, 140, and 160 includes a transistor and an inverter coupled to the transistor.

For example, the first sampler 100 includes a transistor Q1, which receives a start signal IN, and a first inverter 105, which is coupled to the transistor Q1. Also, an inverted clock signal /CLK is applied to a gate terminal of the transistor Q1. The transistor Q1 is turned on/off in response to the inverted clock signal /CLK. Since the transistor Q1 of the first sampler 100 transmits the start signal IN to the first inverter 105 in response to the inverted clock signal /CLK, or a clock signal CLK (in the case of some other samplers), a transmission gate may be used instead of the transistor Q1. Although it is illustrated in FIG. 2 that the transistors are PMOS transistors, the transistors may be NMOS transistors.

Because the exemplary transistor Q1 is shown as a PMOS transistor, it is turned on during a low-level period of the inverted clock signal /CLK to permit the start signal IN to be transmitted to the first inverter 105. Since the transistor Q1 is turned on during a low-level period of the inverted clock signal /CLK, it samples the start signal IN on a falling edge of the inverted clock signal /CLK. The first inverter 105 inverts the sampled signal and generates an output signal OUT1. The output signal OUT1 becomes an input signal for the second sampler 120.

The second sampler 120 has the same construction as the first sampler 100. But, the input signal to the second sampler 120 is the output signal OUT1 of the first sampler 100, and a transistor Q2 is turned on/off in response to the clock signal CLK. The transistor Q2 samples the output signal OUT1 during a low-level period of the clock signal CLK, and a second inverter 125 inverts the sampled signal and generates the output signal OUT2.

The third and fourth samplers 140 and 160 have the same configuration with the first sampler 100. But, the third sampler 140 receives the output signal OUT2 of the second sampler 120, samples the output signal OUT2 in response to the inverted clock signal /CLK which controls on and off operations of a transistor Q3, inverts the sampled signal via a third inverter 145, and generates the output signal OUT3. Also, the fourth sampler 160 includes a transistor Q4 and a fourth inverter 165. The clock signal CLK is applied to a gate terminal of the transistor Q4, and the transistor Q4 samples the output signal OUT3 of the third sampler 140 on a falling edge of the clock signal CLK. The fourth inverter 165 inverts the sampled signal and generates the output signal OUT4. Each of the inverters 105, 125, 145, and 165 may be replaced by a latch.

In FIG. 2, it can be seen that the inverted clock signal /CLK is applied to the odd samplers, and the clock signal CLK is applied to the even samplers. In a different embodiment, the clock signal CLK may be applied to the odd samplers, the inverted clock signal /CLK may be applied to the even samplers, and the transistors Q1, Q2, Q3, and Q4 may be NMOS transistors.

Figure 3:
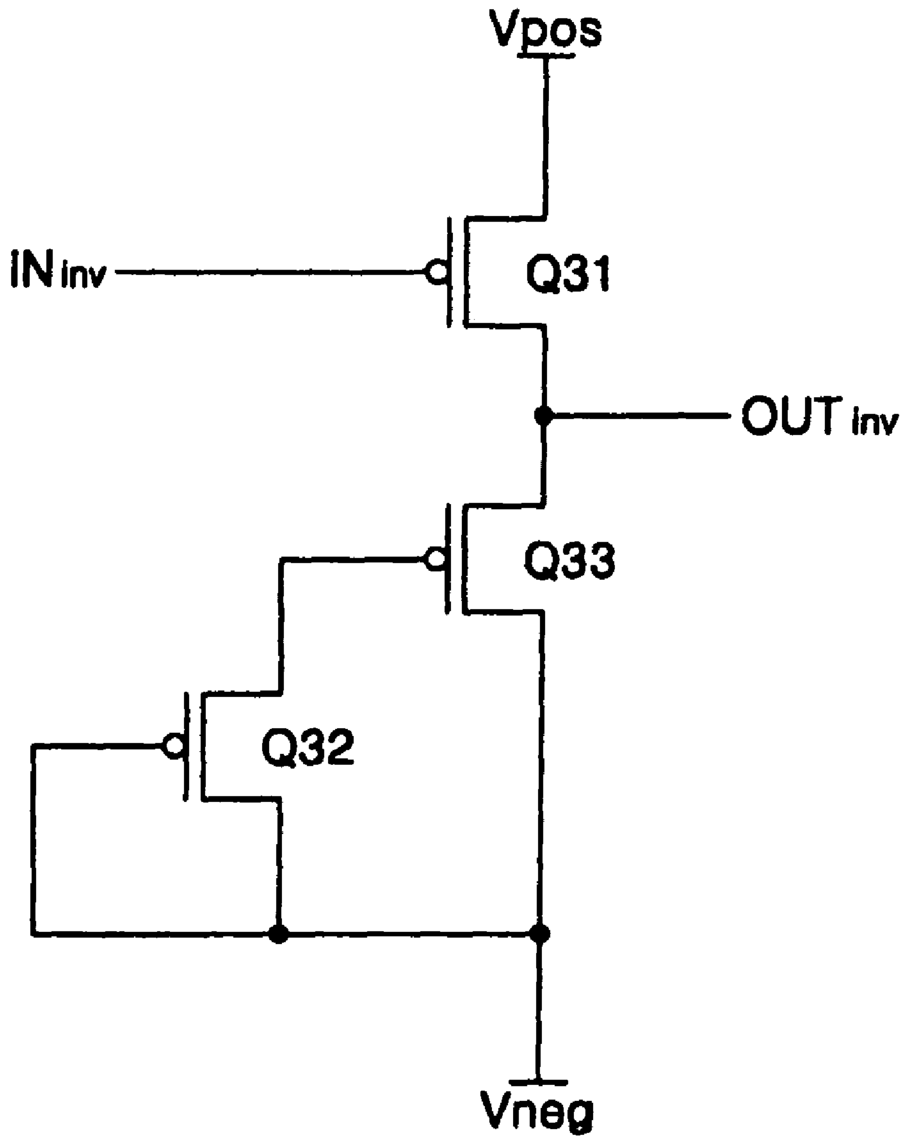
FIG. 3 is a circuit diagram of an inverter shown in FIG. 2.

FIG. 3 is a circuit diagram of any one of the inverters 105, 125, 145, 165 shown in FIG. 2.

Referring to FIG. 3, the inverter includes three transistors Q31, Q32, and Q33. The transistor Q31 is coupled between a positive power supply rail Vpos and an output terminal of the inverter $OUT_{inv}$. Also, an input signal $IN_{inv}$ of the inverter is applied to a gate terminal of the transistor Q31.

The transistor Q32 is coupled between a negative power supply rail Vneg and a gate terminal of the transistor Q33. Since a gate terminal of the transistor Q32 is coupled to the negative power supply rail Vneg, the transistor Q32 is diode-connected. The transistor Q33 is coupled between the output terminal $OUT_{inv}$ of the inverter and the negative power supply rail Vneg. The gate terminal of the transistor Q33 is coupled to the transistor Q32.

In the exemplary embodiment shown, the transistors Q31, Q32, and Q33 are shown as PMOS transistors. Therefore, when the input signal $IN_{inv}$ of the inverter is at a low level, the transistor Q31 is turned on. Also, the diode-connected transistor Q32 and the transistor Q33 are turned on. A channel width to channel length ratio W/L of the transistor Q31 may be larger than a channel width to length ratio of the transistor Q33. Due to the turned-on transistor Q31, an output signal $OUT_{inv}$ remains at a high level. Also, the transistor Q33 operates as an active load.

When the input signal $IN_{inv}$ of the inverter is at a high level, the transistor Q31 is turned off. However, the transistor Q33 remains on due to the diode-connected transistor Q32, thus the output signal $OUT_{inv}$ changes to a low level.

The inverters shown in FIG. 2 may have various different constructions and is not restricted to the above exemplary embodiment.

Figure 4:
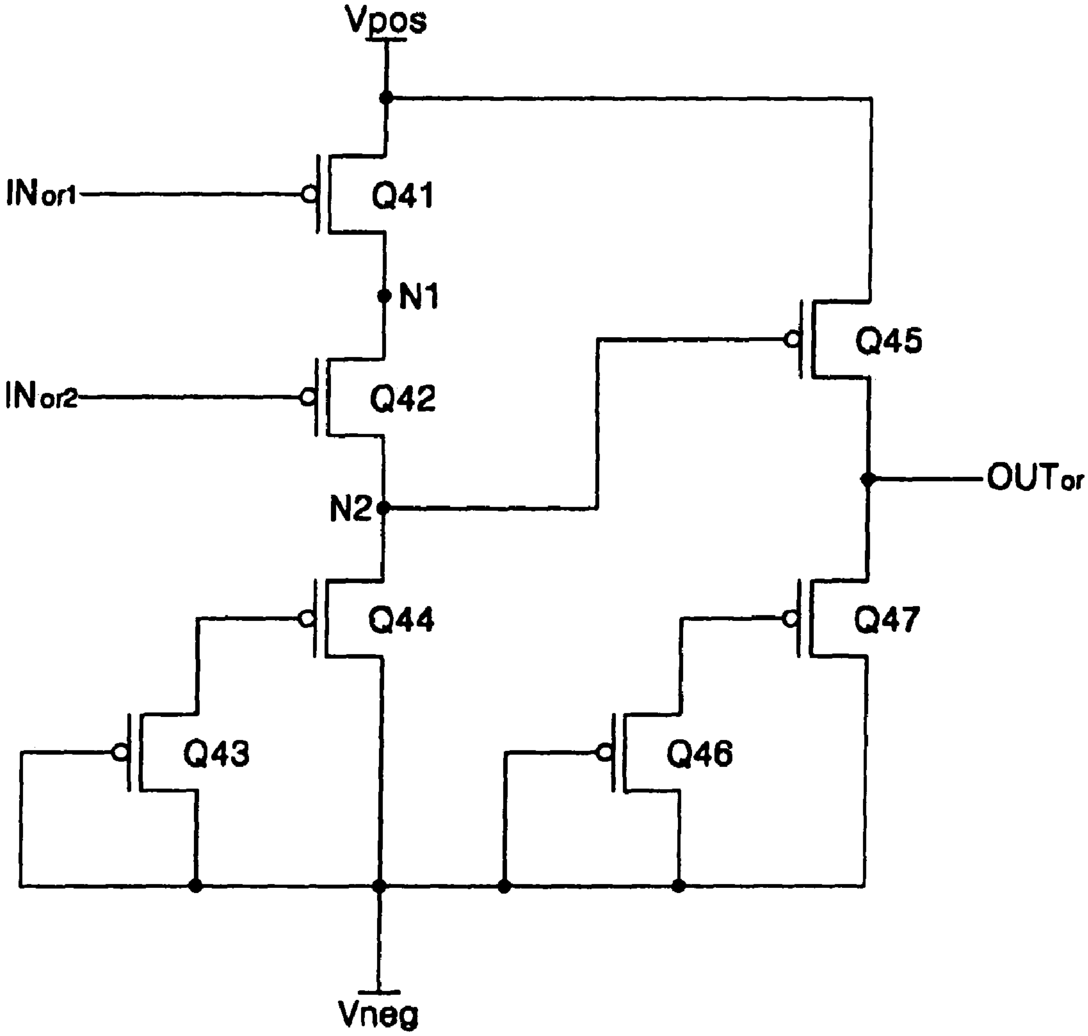
FIG. 4 is a circuit diagram of an OR gate shown in FIG. 1.

FIG. 4 is a circuit diagram of any one of the OR gates 110, 150 shown in FIG. 1.

Referring to FIG. 4, a transistor Q41 is coupled to a positive power supply rail Vpos and a first node N1. A first input signal $IN_{or1}$ of the OR gate is applied to a gate terminal of the transistor Q41. A transistor Q42 is coupled between the first node N1 and a second node N2. A second input signal $IN_{or2}$ of the OR gate is applied to a gate terminal of the transistor Q42.

Transistors Q43 and Q44 operate as active loads of the transistors Q41 and Q42. The transistor Q43 is coupled between a negative power supply rail Vneg and a gate terminal of the transistor Q44. A gate terminal of the transistor Q43 is also coupled to the negative power supply rail Vneg, so that the transistor Q43 is diode-connected. The transistor Q44 is coupled between the second node N2 and the negative power supply rail Vneg. The gate terminal of the transistor Q44 is coupled to the diode-connected transistor Q43.

A transistor Q45 is coupled between the positive power supply rail Vpos and an output terminal $OUT_{or}$ of the OR gate. A gate terminal of the transistor Q45 is coupled to the second node N2.

Transistors Q46 and Q47 operate as active loads of the transistor Q45. The transistor Q46 is coupled between the negative power supply rail Vneg and a gate terminal of the transistor Q47. A gate terminal of the transistor Q46 is also coupled to the negative power supply rail Vneg, so that the transistor Q46 is diode-connected. The transistor Q47 is coupled between the output terminal of the OR gate and the negative power supply rail Vneg. The gate terminal of the transistor Q47 is coupled to the diode-connected transistor Q46.

The transistors Q41, Q42, Q43, and Q44 operate as NOR gates. In particular, the transistors Q43 and Q44 operate as active loads of the NOR gate. Also, the transistors Q45, Q46, and Q47 operate as inverters. In particular, the transistors Q46 and Q47 operate as active loads of the inverter. The NOR gates and the inverters together yield the OR gates 110, 150.

In the exemplary embodiment shown, when at least one of the two input signals $IN_{or1}$ and $IN_{or2}$ is at a high level, electrical connection between the positive power supply rail Vpos and the second node N2 is cut off. As the transistor Q44 operates as the active load, the second node N2 is at a low level. The transistor Q45 is turned on in response to the low-level signal of the node N2, thus an output signal $OUT_{or}$ goes to a high level.

When both the input signals $IN_{or1}$ and $IN_{or2}$ are at a low level, the positive power supply rail Vpos is electrically coupled to the second node N2, and a high-level signal is applied to the second node N2. The transistor Q45 is turned off in response to the high-level signal of the node N2. Accordingly, as the transistor Q47 operates as the active load, the output signal $OUT_{or}$ goes to a low level.

In summary, if one or both inputs are high, the output will be high and if both inputs are low, the output is low. As a result, the circuit shown in FIG. 4 performs a logical OR operation in the above-described manner.

Figure 5:
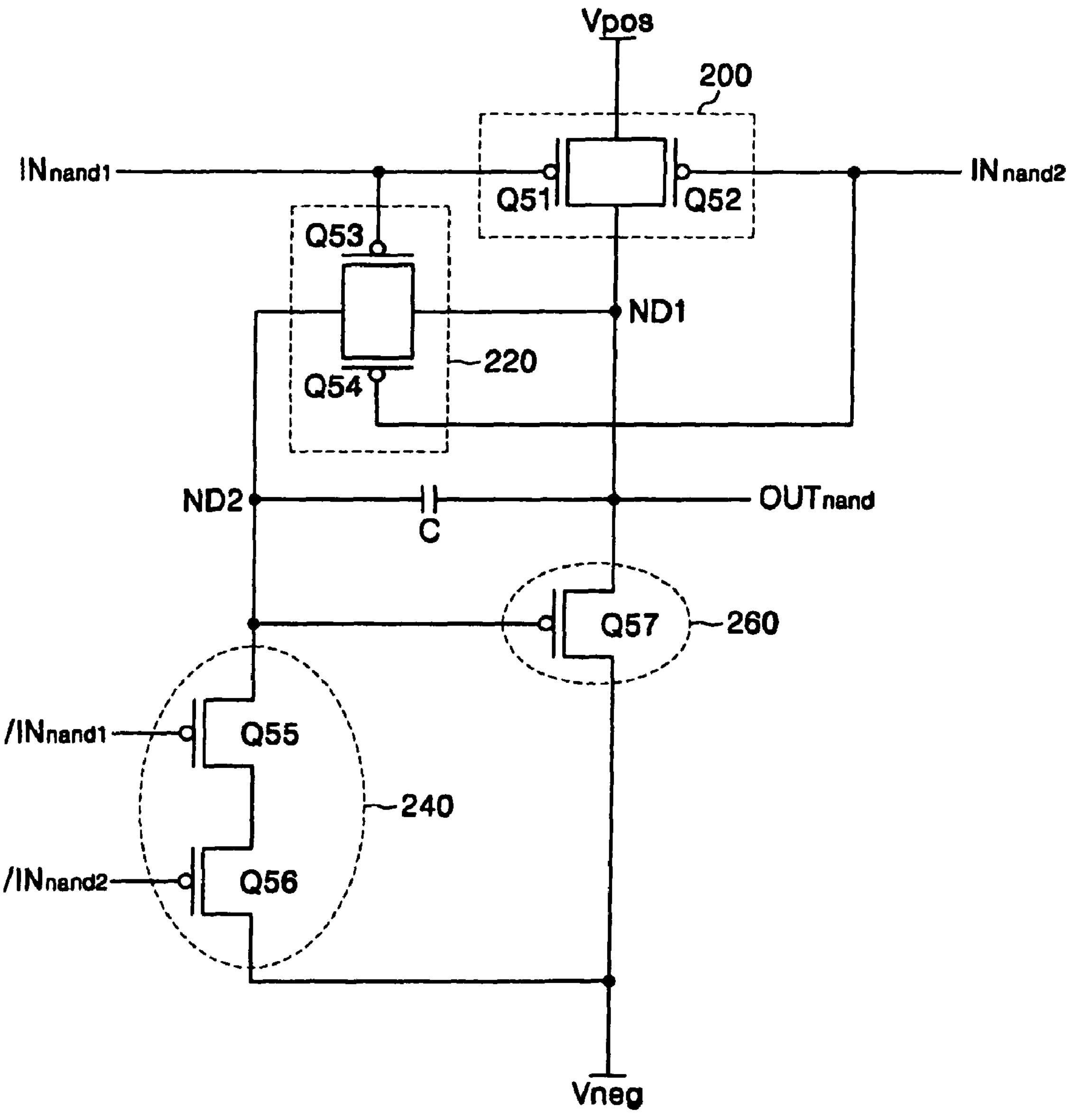
FIG. 5 is a circuit diagram of a NAND gate shown in FIG. 1.

FIG. 5 is a circuit diagram of the NAND gate 130 shown in FIG. 1.

Referring to FIG. 5, the NAND gate circuit includes first and second switching units 200 and 220, an active load 260, and an active load selection unit 240. In other embodiments, the NAND gate may further include a capacitor C.

The first switching unit 200 is coupled between a positive power supply rail Vpos and a first node ND1. The first switching unit 200 includes two transistors Q51 and Q52, which are coupled opposite to each other. That is, two electrodes of the transistor Q51 are coupled to two electrodes of the transistor Q52. Also, an input signal $IN_{nand1}$ is applied to a gate terminal of the transistor Q51, and an input signal $IN_{nand2}$ is applied to a gate terminal of the transistor Q52.

The second switching unit 220 is coupled between the first node ND1 and a second node ND2. The second switching unit 220 includes two transistors Q53 and Q54, which are coupled opposite to each other. That is, two electrodes of the transistor Q53 are coupled to two electrodes of the transistor Q54. Also, an input signal $IN_{nand1}$ is applied to a gate terminal of the transistor Q53, and an input signal $IN_{nand2}$ is applied to a gate terminal of the transistor Q54.

The active load selection unit 240 is coupled between the second node ND2 and a negative power supply rail Vneg and includes two transistors Q55 and Q56. The transistor Q55 is coupled between the second node ND2 and the transistor Q56 and is turned on/off in response to an inverted input signal /$IN_{nand1}$. The transistor Q56 is coupled between the transistor Q55 and the negative power supply rail Vneg. An inverted input signal /$IN_{nand2}$ is applied to a gate terminal of the transistor Q56, and the transistor Q56 is turned on/off in response to the inverted input signal /$IN_{nand2}$.

The active load 260 includes a transistor Q57 coupled between the first node ND1 and the negative power supply rail Vneg. A signal of the second node ND2 is applied to a gate terminal of the transistor Q57.

The capacitor C is coupled between the first node ND1 and the second node ND2. The capacitor C is used to maintain an output signal $OUT_{nand}$ of the first node ND1 at a certain level for a predetermined period.

When at least one of the two input signals $IN_{nand1}$ and $IN_{nand2}$ is at a low level, the first and second switching units 200 and 220 are turned on. Accordingly, the first and second nodes ND1 and ND2 are at a high level because they are connected to the positive power supply rail Vpos. Also, at least one of the transistors Q55 and Q56 of the active load selection unit 240 is turned off in response to the inverted input signals $/IN_{nand1}$ and $/IN_{nand2}$. Accordingly, electrical connection between the negative power supply rail Vneg and the second node ND2 is cut off. Because the gate terminal, coupled to the second ND2, and a source terminal, coupled to the first node ND1, of the transistor Q57 are substantially at the same level, the transistor Q57 is turned off. As a result, a high-level signal is transmitted from the positive power supply rail Vpos through the first switching unit 200 to the first node ND1 and cannot pass through the active load 260 that is turned off. Thus, the output signal $OUT_{nand}$ goes to or remains at a high level.

When both the input signals $IN_{nand1}$ and $IN_{nand2}$ are at a high level, the first and second switching units 200 and 220 are turned off. Accordingly, an electrical path from the positive power supply rail Vpos to the first node ND1 is cut off, and an electrical path from the first node ND1 to the second node ND2 is also cut off. Since both the inverted input signals $/IN_{nand1}$ and $/IN_{nand2}$ are at a low level, the active load selection unit 240 is turned on. That is, an electrical path is formed between the second node ND2 and the negative power supply rail Vneg. As the active load selection unit 240 is turned on, a signal of the second node ND2 is substantially at the same level as the negative power supply rail Vneg. Also, the transistor Q57 of the active load 260 is turned on in response to the signal level of the second node ND2, thus the output signal $OUT_{nand}$ goes to or remains at a low level.

Although the positive power supply rails Vpos and the negative power supply rails Vneg illustrated in the exemplary embodiments of FIGS. 3, 4, and 5 are the same, power supply rails for the inverter, power supply rails for the OR gate, and power supply rails for the NAND gate may be different from one another in other embodiments. That is, the respective power supply rails may have different levels and power supplies.

Figure 6:
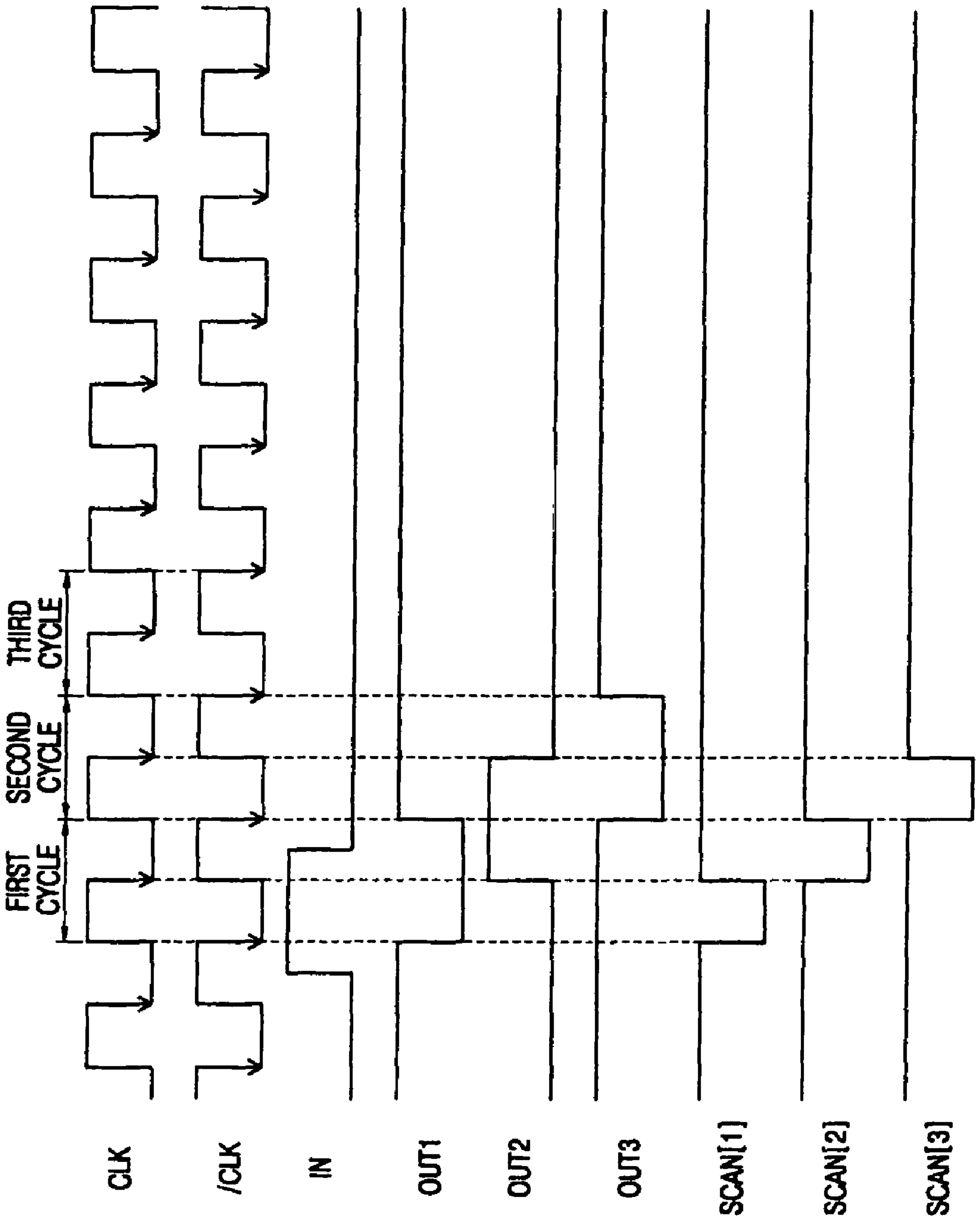
FIG. 6 is a timing diagram illustrating the operation of the scan driver shown in FIG. 1.

FIG. 6 is a timing diagram illustrating the operation of the scan driver shown in FIG. 1.

Referring to FIGS. 1 and 6, a start signal IN is sampled on a falling edge of a first cycle of an inverted clock signal /CLK. The sampled start signal IN is inverted in the first sampler 100. Since the start signal IN remains at a high level on the falling edge and during a low-level period of the inverted clock signal /CLK, an output signal OUT1 of the first sampler 100 remains at a low level for a first cycle of the inverted clock signal. The output signal OUT1 is applied to the first OR gate 110 and the second sampler 120.

The second sampler 120 samples the signal OUT1 on a falling edge of a first cycle of a clock signal CLK. The sampled signal OUT1 is inverted in the second sampler 120. Since the signal OUT1 remains at a low level on the falling edge and during a low-level period of the first cycle of the clock signal CLK, an output signal OUT2 of the second sampler 120 remains at a high level from the low-level period of the first cycle of the clock signal CLK to a high-level period of a second cycle of the clock signal. The output signal OUT2 of the second sampler 120 is applied to the first OR gate 110, the NAND gate 130, and the third sampler 140.

The third sampler 140 samples the signal OUT2 on a falling edge of a second cycle of the inverted clock signal /CLK. The sampled signal OUT2 is inverted in the third sampler 140. Since the signal OUT2 remains at a high level on the falling edge and during a low-level period of the second cycle of the inverted clock signal /CLK, an output signal OUT3 of the third sampler 140 remains at a low level for the second cycle of the inverted clock signal /CLK.

The first OR gate 110 performs a logical OR operation on the output signal OUT1 of the first sampler 100 (i.e., the input signal of the second sampler 120) and the output signal OUT2 of the second sampler 120 and generates a first scan signal SCAN[1] that is at a low level during a high-level period of the first cycle of the clock signal CLK.

Also, the first NAND gate 130 performs a NAND operation on the input and output signals OUT2 and OUT3 of the third sampler 140 and generates a scan signal SCAN[2] that is at a low level during a low-level period of the first cycle of the clock signal CLK.

The second OR gate 150 performs a logical OR operation on the input and output signals OUT3 and OUT4 (not shown in FIG. 6) of the fourth sampler 160 and generates a third scan signal SCAN[3] that is at a low level during a high-level period of the second cycle of the clock signal CLK.

That is, odd scan signals SCAN[1, 3, 5, . . . ] are generated by a logical OR operation on the input and output signals of even samplers, while even scan signals SCAN[2, 4, 6, . . . ] are generated by a NAND operation on input and output signals of odd samplers.

In other embodiments, by applying a clock signal CLK and a start signal IN in different manners, the odd scan signals SCAN[1, 3, 5, . . . ] may be generated by a NAND operation, and the even scan signals SCAN[2, 4, 6, . . . ] may be generated by a logical OR operation.

Although in the exemplary embodiment shown, the samplers 100, 120, 140, and 160, the OR gates 110 and 150, and the NAND gate 140, each include PMOS transistors, NMOS transistors may be used instead. However, all the transistors of the scan driver have the same conductivity type. The transistors of the scan driver may have the same conductivity type as transistors of the pixel being driven by the scan signals.

As described above, the scan driver of the invention includes transistors of the same conductivity type and has a simple circuit construction. Accordingly, the scan driver and the pixels of the display device can be easily formed on the same substrate using a System On Panel (SOP) technique.

Embodiments of the present invention describe a scan driver that can be formed using transistors of the same conductivity type. The scan driver of the invention also can have a simple circuit that can be easily formed on a substrate.

Figure 7:
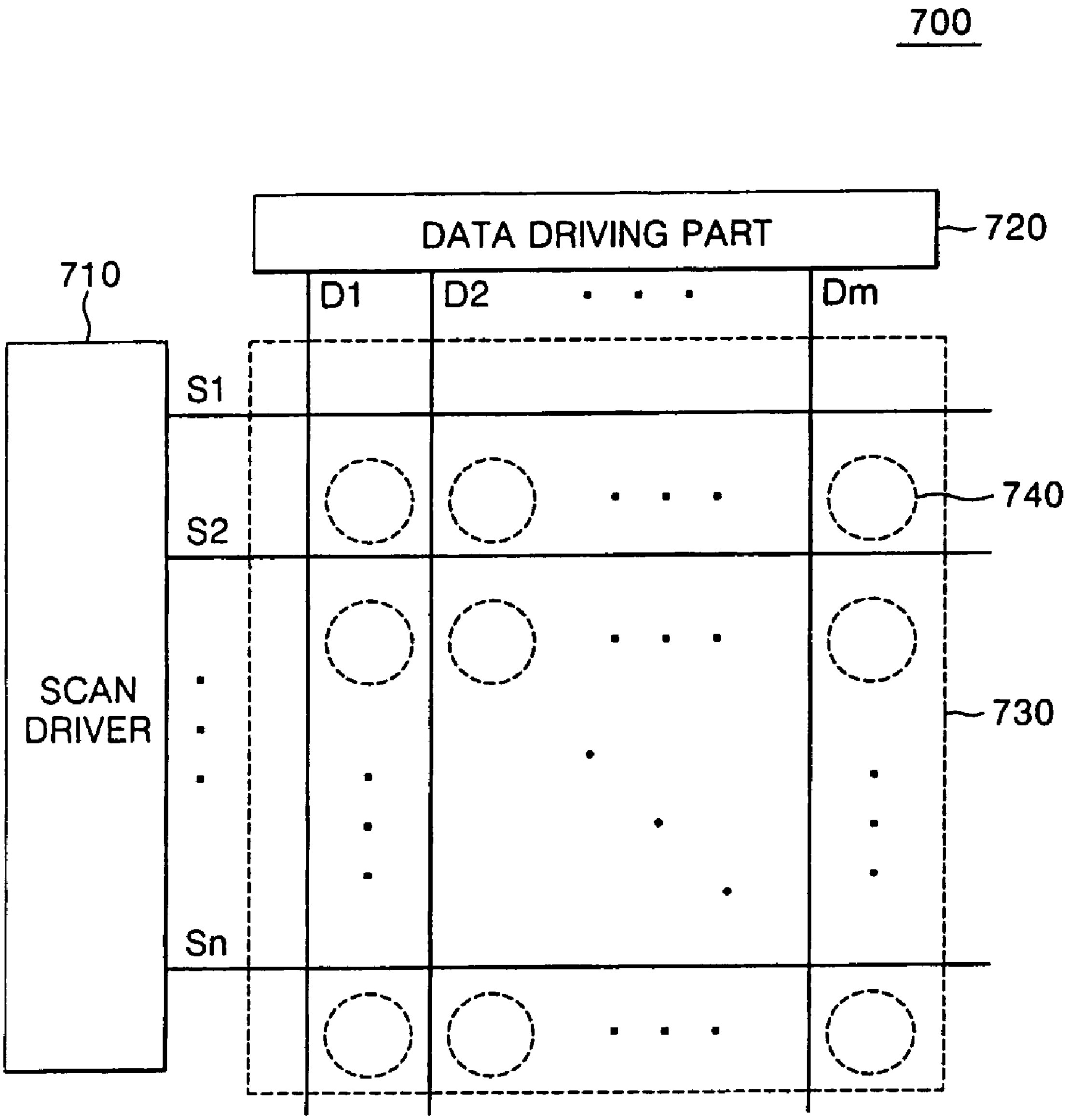
FIG. 7 is an OLED according to the embodiments of the present invention.

FIG. 7 shows an organic light emitting display device 700 according to the embodiments of the present invention. The organic light emitting display device 700 of FIG. 7 may include the scan driver described by the embodiments of the present invention. The organic light emitting display device 700 includes a display region 730 including pixels 740 coupled to scan lines S1 to Sn and data lines D1 to Dm, scan driver 710 for driving the scan lines S1 to Sn, and a data driving part 720 for driving the data lines D1 to Dm. The scan driver 710 generates the scan signals and supplies the generated scan signals to the scan lines S1 to Sn. The data driving part 720 generates data signals and supplies the generated data signals to the data lines D1 to Dm in synchronization with the scan signals. The display region 730 receives first and second power from a first power source ELVDD and a second power source ELVSS from the outside, respectively, and supplies the first and second power to the pixels 740. The pixels 740 then control the currents that flow from the first power source ELVDD to the second power source ELVSS vian organic light emitting diode devices in response to the data signals to generate light components corresponding to the data signals.

Although exemplary embodiments of the present invention have been described for illustrative purposes, those skilled in the art will appreciate that various modifications, additions and substitutions are possible, without departing from the scope and spirit of the invention as disclosed in the accompanying claims and their equivalents.

What is claimed is:

1. A scan driver comprising:

a first sampler for sampling an input signal in synchronization with an inverted clock signal;

a second sampler for sampling an output signal of the first sampler in synchronization with a clock signal;

a third sampler for sampling an output signal of the second sampler in synchronization with the inverted clock signal;

an OR gate for performing a logical OR operation on the output signal of the first sampler and the output signal of the second sampler to generate a first scan signal; and a NAND gate for performing a NAND operation on the output signal of the second sampler and an output signal of the third sampler to generate a second scan signal, wherein the first sampler, the second sampler, the third sampler, the OR gate, and the NAND gate include transistors of a first conductivity type.

2. The scan driver according to claim 1, wherein each one of the first sampler and the third sampler includes:

a first transistor for sampling a sampler input signal on a falling edge of the inverted clock signal; and a first inverter for inverting an output signal of the first transistor, wherein the sampler input signal is the input signal for the first sampler and the output signal of the second sampler for the third sampler.

3. The scan driver according to claim 2, wherein the second sampler includes:

a second transistor for sampling a second sampler input signal on a falling edge of the clock signal; and a second inverter for inverting an output signal of the second transistor, wherein the second sampler input signal is the output signal of the first sampler.

4. The scan driver according to claim 3, wherein each one of the first inverter, the second inverter and the third inverter includes:

a first inverter transistor coupled between a positive power supply rail and a sampler output terminal for receiving an inverter input signal at a gate of the first inverter transistor;

a second inverter transistor being diode-connected and coupled to a negative power supply rail; and a third inverter transistor coupled between the sampler output terminal and the negative power supply rail and being turned on/off in response to a source-drain voltage of the second inverter transistor being applied at a gate of the third inverter transistor, wherein the inverter input signal is the sampler input signal for the first sampler and the third sampler and the second sampler input signal for the second sampler.

5. The scan driver according to claim 1, wherein the OR gate includes:

a first transistor coupled between a positive power supply rail and a first node and turned on/off in response to a first input signal;

a second transistor coupled between the first node and a second node and turned on/off in response to a second input signal;

a third transistor coupled to a negative power supply rail and diode-connected;

a fourth transistor coupled between the second node and the negative power supply rail and turned on/off in response to a source-drain voltage of the third transistor;

a fifth transistor coupled between the positive power supply rail and an OR gate output terminal and turned on/off in response to a voltage of the second node;

a sixth transistor coupled to the negative power supply rail and diode-connected; and a seventh transistor coupled between the OR gate output terminal and the negative power supply rail and turned on/off in response to a source-drain voltage of the sixth transistor.

6. The scan driver according to claim 1, wherein the NAND gate includes:

a first switching unit coupled between a positive power supply rail and a first node that is a NAND gate output terminal and turned on/off in response to a first input signal or a second input signal;

a second switching unit coupled between the first node and a second node and turned on/off in response to the first input signal or the second input signal;

an active load selection unit coupled between the second node and a negative power supply rail and turned on/off in response to an inverted first input signal and an inverted second input signal; and an active load coupled between the first node and the negative power supply rail and turned on/off in response to a voltage of the second node.

7. The scan driver according to claim 6, wherein the NAND gate further includes a capacitor coupled between the first node and the second node for maintaining a level of a NAND gate output signal for a predetermined period.

8. A scan driver comprising:

a first sampler for sampling a start signal in synchronization with a first clock signal;

a second sampler for sampling an output signal of the first sampler in synchronization with a second clock signal, the second clock signal being an inverted signal of the first clock signal;

a third sampler for sampling an output signal of the second sampler in synchronization with the first clock signal;

an OR gate for performing a logical OR operation on an OR gate input signal and the output signal of the second sampler and generating an odd scan signal; and a NAND gate for performing a NAND operation on a NAND gate input signal and an output signal of the third sampler and generating an even scan signal, wherein transistors of the first sampler, the second sampler, the third sampler, the OR gate, and the NAND gate have the same conductivity type.

9. The scan driver according to claim 8, wherein each one of the first sampler and the third sampler includes:

a first transistor for sampling a sampler input signal on a falling edge of the first clock signal; and a first latch for inverting an output signal of the first transistor and storing the inverted signal.

10. The scan driver according to claim 9, wherein the second sampler includes:

a second transistor for sampling a second sampler input signal on a falling edge of the second clock signal; and a second latch for inverting an output signal of the second transistor and storing the inverted signal.

11. The scan driver according to claim 8, wherein the OR gate includes:

a first transistor coupled between a positive power supply rail and a first node and turned on/off in response to a first OR gate input signal;

a second transistor coupled between the first node and a second node and turned on/off in response to a second OR gate input signal;

a third transistor coupled to a negative power supply rail and diode-connected;

a fourth transistor coupled between the second node and the negative power supply rail and turned on/off in response to a source-drain voltage of the third transistor;

a fifth transistor coupled between the positive power supply rail and an OR gate output terminal and turned on/off in response to a voltage of the second node;

a sixth transistor coupled to the negative power supply rail and diode-connected; and a seventh transistor coupled between the output terminal and the negative power supply rail and turned on/off in response to a source-drain voltage of the sixth transistor.

12. The scan driver according to claim 8, wherein the NAND gate includes:

a first switching unit coupled between a positive power supply rail and a first node that is a NAND gate output terminal and turned on/off in response to a first NAND gate input signal or a second NAND gate input signal;

a second switching unit coupled between the first node and a second node and turned on/off in response to the first NAND gate input signal or the second NAND gate input signal;

an active load selection unit coupled between the second node and a negative power supply rail and turned on/off in response to an inverted first NAND gate input signal or an inverted second NAND gate input signal; and an active load coupled between the first node and the negative power supply rail and turned on/off in response to a voltage of the second node.

13. An organic light emitting display device comprising:

a display region having pixels for displaying an image;

a data driver coupled to the display region by data lines, the data driver for transmitting data signals to the pixels to display the image;

a scan driver coupled to the display region by scan lines, the scan driver for transmitting scan signals to the pixels to display the image, the scan driver comprising:

a first sampler for sampling an input signal in synchronization with an inverted clock signal;

a second sampler for sampling an output signal of the first sampler in synchronization with a clock signal;

a third sampler for sampling an output signal of the second sampler in synchronization with the inverted clock signal;

an OR gate for performing a logical OR operation on the output signal of the first sampler and the output signal of the second sampler to generate a first scan signal; and a NAND gate for performing a NAND operation on the output signal of the second sampler and an output signal of the third sampler to generate a second scan signal, wherein the first scan signal and the second scan signal are provided to the display region to select the pixels for displaying the image, and wherein the first sampler, the second sampler, the third sampler, the OR gate, and the NAND gate include transistors of a first conductivity type.

14. The organic light emitting display device of claim 13, wherein all of the transistors of the organic light emitting display device have the first conductivity type.

15. The organic light emitting display device of claim 13, wherein the first scan signal generated by the OR gate for performing a logical OR operation on the output signal of the first sampler and the output signal of the second sampler is an odd scan signal, and wherein the second scan signal generated by the NAND gate for performing a NAND operation on the output signal of the second sampler and the output signal of the third sampler is an even scan signal.

16. A method for generating scan signals for input to scan lines of an organic light emitting display device and driving pixels included in the organic light emitting display device, the method comprising:

receiving three input signals including a clock signal, an inverted clock signal, and a start signal;

sampling the start signal using a first cycle of the inverted clock signal to generate a first sampled signal;

inverting the first sampled signal to generate a first inverted sampled signal;

sampling the first inverted sampled signal using a first cycle of the clock signal to generate a second sampled signal;

inverting the second sampled signal to generate a second inverted sampled signal;

generating a first scan signal by performing a logical OR operation on the first inverted sampled signal and the second inverted sampled signal;

sampling the second inverted sampled signal using a second cycle of the inverted clock signal to generate a third sampled signal;

inverting the third sampled signal to generate a third inverted sampled signal; and generating a second scan signal by performing a logical NAND operation on the second inverted sampled signal and the third inverted sampled signal.

17. The method of claim 16, wherein the start signal is being sampled using a falling edge of the first cycle of the inverted clock signal, wherein the first inverted sampled signal is being sampled using a falling edge of the first cycle of the clock signal, and wherein the second inverted sampled signal is being sampled using a falling edge of the second cycle of the inverted clock signal.

18. The method of claim 16, wherein odd-numbered scan signals are generated by performing logical OR operations on two consecutive inverted sampled signals, the earlier inverted sampled signal being sampled during an odd-numbered clock cycle, and wherein even-numbered scan signals are generated by performing logical NAND operations on two consecutive inverted sampled signals, the earlier inverted sampled signal being sampled during an even-numbered clock cycle.

19. The scan driver of claim 1, wherein the first and second scan signals are provided sequentially and mutually exclusively.

20. The organic light emitting display device of claim 13, wherein the first and second scan signals are provided sequentially and mutually exclusively.

* * * * *